United States Patent
Bernstein et al.

(10) Patent No.: US 6,956,417 B2
(45) Date of Patent: Oct. 18, 2005

(54) LEAKAGE COMPENSATION CIRCUIT

(75) Inventors: Kerry Bernstein, Underhill, VT (US);
Anthony R. Bonaccio, Shelburne, VT (US); John A. Fifield, Underhill, VT (US); Allen P. Haar, Essex Junction, VT (US); Shiu C. Ho, Essex Junction, VT (US); Terence B. Hook, Jericho, VT (US); Michael A. Soma, Hopewell Junction, NY (US); Stephen D. Wyatt, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 54 days.

(21) Appl. No.: 10/707,123

(22) Filed: Nov. 21, 2003

(65) Prior Publication Data

US 2005/0110535 A1  May 26, 2005

(51) Int. Cl.[7] ............................................. H03L 7/06
(52) U.S. Cl. ........................ 327/157; 331/362; 331/156
(58) Field of Search .............................. 327/156, 157, 327/147, 362; 331/17, 36 R; 375/294, 327

(56) References Cited

U.S. PATENT DOCUMENTS

| | | | | |
|---|---|---|---|---|
| 4,862,312 A | * | 8/1989 | Ishii | ............................ 361/96 |
| 6,344,772 B1 | * | 2/2002 | Larsson | ....................... 327/552 |
| 6,573,770 B1 | * | 6/2003 | Gauthier et al. | ............. 327/156 |
| 6,614,287 B1 | * | 9/2003 | Gauthier et al. | ............. 327/362 |
| 6,861,885 B2 | * | 3/2005 | Trivedi et al. | ............... 327/156 |
| 2005/0035797 A1 | * | 2/2005 | Frans et al. | .................. 327/156 |

FOREIGN PATENT DOCUMENTS

JP              63240215       * 10/1988

* cited by examiner

Primary Examiner—Dinh T. Lee
(74) Attorney, Agent, or Firm—Schmeiser, Olsen & Watts; Anthony Canale

(57) ABSTRACT

A circuit, including: a capacitor coupled between a first circuit node and a second circuit node and that leaks a leakage current from the first circuit node to the second circuit node; and a compensation circuit adapted to supply a compensatory current to compensate for the leakage current to the first circuit node.

39 Claims, 7 Drawing Sheets

LEAKAGE COMPENSATION CIRCUIT

BACKGROUND OF INVENTION

1. Field of the Invention

The present invention relates to the field of electronic circuits; more specifically, it relates to a circuit that compensates for leakage current through a capacitor.

2. Background of the Invention

Dielectric leakage is a significant problem in the design of very precise analog and/or digital circuits. For example, when a P-channel field effect transistor (PFET) is used as a capacitor (PCAP) or when an N-channel field effect transistor (NFET) is used as a capacitor (NCAP) for the loop filter capacitor of a phase locked loop (PLL) circuit, leakage due to tunneling when the gate dielectric is less than 2.0 nm thick can cause the oscillator frequency of the PLL to drift between capacitor refresh cycles resulting in unacceptable jitter and reduced performance. Alternative schemes of using thick dielectric capacitors can introduce unwanted capacitor-voltage (C-V) curve distortions as well as increase die area and fabrication steps and thus increase fabrication time and cost. Therefore, a method for compensating leakage current through a capacitor in very precise analog and digital circuits is needed.

SUMMARY OF INVENTION

A first aspect of the present invention is a circuit, comprising: a capacitor coupled between a first circuit node and a second circuit node and that leaks a leakage current from the first circuit node to the second circuit node; and a compensation circuit adapted to supply a compensatory current to compensate for the leakage current to the first circuit node.

A second aspect of the present invention is a phase locked loop circuit, comprising: an output of a phase detector connected to the input of a charge pump; an input of a compensated loop filter connected to and output of the charge pump; an input of a voltage controlled oscillator connected to the output of the compensated loop filter; an output of the voltage controlled oscillator connected to an input of the phase detector; and the compensated loop filter comprising: a capacitor coupled between a first circuit node and a second circuit node that leaks a leakage current from the first circuit node to the second circuit node; a secondary resistor connected between the first circuit node and a secondary capacitor, the secondary capacitor connected between the secondary resistor and the second circuit node; and a compensation circuit adapted to supply a compensatory current to compensate for the leakage current to the first circuit node.

A third aspect of the present invention is a method of compensating a capacitor that leaks current between a first circuit node and a second circuit node, comprising: a capacitor coupling between the first circuit node and the second circuit node; a compensation circuit adapted to supply a compensatory current to compensate for the leakage current to the first circuit node.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

While the present invention is most useful in applications using PCAPs (PFETs with source/drain tied to $V_{DD}$) and NCAPs (NFETS with source/drain tied to $V_{SS}$) the invention is equally applicable to applications other integrated circuit capacitors such as metal-insulator-metal capacitors (MIM-CAPS) where the two plates and intervening dielectric are incorporated into the wiring layers of an integrated circuit chip, trench capacitors and deep trench (DT) capacitors where a dielectric lined polysilicon filled trench is formed in a silicon substrate of an integrated circuit chip as well as to applications using discrete capacitors such as electrolytic, tantalum, mica and ceramic capacitors.

Figure 1:
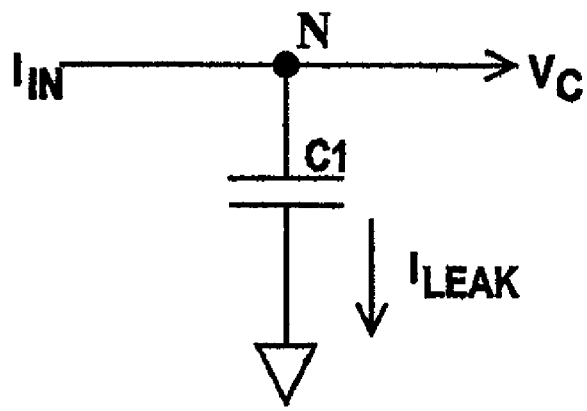
FIG. 1 is a schematic diagram illustrating the use of a capacitor to develop and hold an output voltage.

FIG. 1 is a schematic diagram illustrating the use of a capacitor to develop and hold an output voltage. In FIG. 1, an input current $I_{IN}$ is applied to a node N and an output voltage $V_C$ is supplied from node N. A capacitor C1 is connected between node N and ground and ideally will hold the voltage $V_C$. Current $I_{IN}$ charges capacitor C1 maintaining voltage $V_C$ at a predetermined voltage level that varies directly as $I_{IN}$ varies. However, if capacitor C1 is leaky a leakage current $I_{LEAK}$ will flow to ground causing voltage $V_c$ to drop from its predetermined value between refresh cycles of $I_{IN}$. The present invention describes several embodiments to compensate for current $I_{LEAK}$ and thus maintain voltage $V_C$ at its predetermined value.

Figure 2:
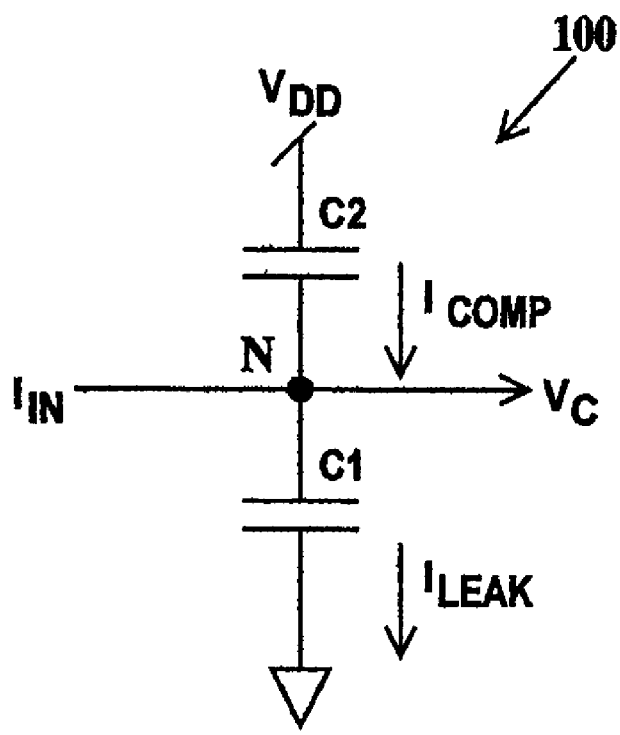
FIG. 2 is a schematic diagram of a circuit illustrating a method for compensating a leakage current through a capacitor according to a first embodiment of the present invention.

FIG. 2 is a schematic diagram of a circuit 100 illustrating a method for compensating for leakage through a capacitor according to a first embodiment of the present invention. In FIG. 2, input current$_{IN}$ is applied to node N and output voltage $V_C$ is supplied from node N. Capacitor C1 is connected between node N and ground. Node N is coupled to a voltage source $V_{DD}$ through capacitor C2. Current $I_{IN}$ charges capacitor C1 maintaining voltage $V_C$ at a predetermined level that varies as $I_{IN}$ varies. However, if capacitor C1 is leaky a leakage current $I_{LEAK}$ will flow to ground causing voltage $V_C$ to drop from its predetermined value between refresh cycles of $I_{IN}$. A compensation capacitor C2 is connected between node N and voltage source $V_{DD}$. Compensation capacitor C2 is charged by voltage source $V_{DD}$ and leaks a compensation current $I_{COMP}$. When current $I_{COMP}$ is equal to current $I_{LEAK}$ voltage $V_C$ will remain constant between current $I_{IN}$ refresh cycles. Current $I_{COMP}$ is equal to current $I_{LEAK}$ when (1) the capacitance of capacitor C1 equals the capacitance of capacitor C2 and (2) $V_C = V_{DD}/2$. If voltage $V_{DD}$ is not equal to twice voltage $V_C$, then voltage $V_C$ will drift between the predetermined value of voltage $V_C$ and a lower voltage between current $I_{IN}$ refresh cycles.

Capacitors C1 and C2 may be the same type of capacitor so the leakage characteristics of both capacitors are the same. Ground may be considered for this and all subsequent embodiments of the present invention, a special case of a second circuit node and need not be at zero potential.

In AC applications, capacitor C2 serves as a functional capacitor controlling output voltage $V_C$ along with capacitor C1 and the capacitance of the two capacitors should be sized with this fact in mind. Both capacitor C1 and capacitor C2 may have half the required capacitance. When fabricated as NCAPs or PCAPS, capacitor C1 and capacitor C2 may have equal gate areas. When fabricated as MIMCAPS, capacitor C1 and capacitor C2 may have equal plate areas. In either case, capacitor C2 may be purposely scaled from capacitor C1 to compensate for known or nominal deviations of $V_C$ from $V_{DD}/2$.

Figure 3:
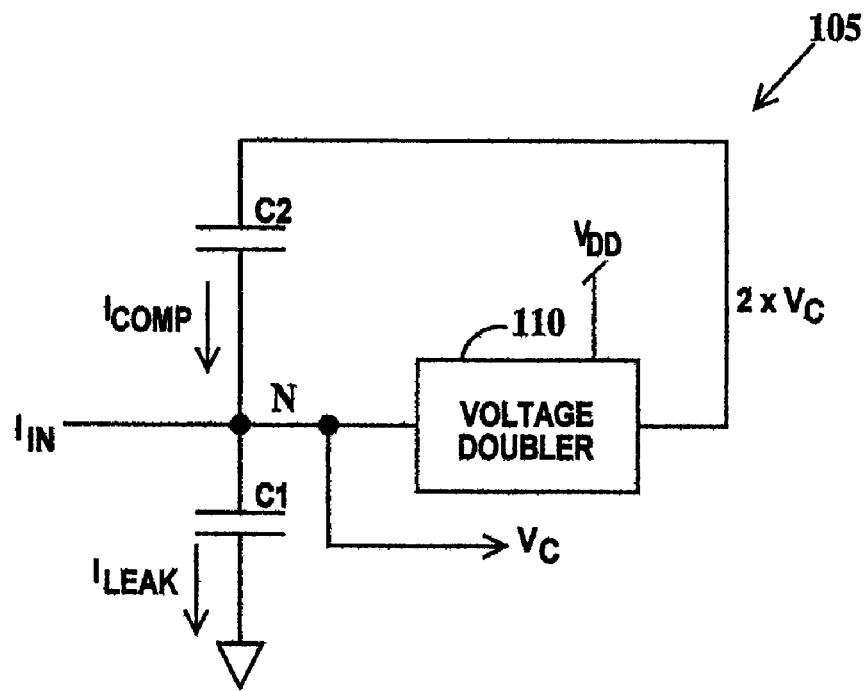
FIG. 3 is a block diagram of a circuit illustrating a method for compensating a leakage current through a capacitor according to a second embodiment of the present invention.

FIG. 3 is a block diagram of a circuit 105 illustrating a method for compensating for leakage through a capacitor according to a second embodiment of the present invention. In FIG. 3, input current$_{IN}$ is applied to node N and output voltage $V_C$ is supplied from node N. Capacitor C1 is connected between node N and ground. A first plate of a compensation capacitor C2 is connected to node N and a second plate of capacitor C2 is connected to the output of a voltage doubler 105. The input of voltage doubler 105 is connected to node N. Voltage doubler 105 thus generates an output voltage equal to twice voltage $V_C$. Voltage doubler 105 is supplied by voltage source $V_{DD}$. Capacitor C2 is charged by voltage doubler 110. Since leakage current is a function of capacitance and voltage across the capacitor, $I_{COMP}$ will equal $I_{LEAK}$ when the capacitance of capacitor C1 and C2 are equal and the voltage across capacitors C1 and C2 is the same. Therefore voltage $V_C$ will remain constant between current $I_{IN}$ refresh cycles when C1=C2.

Capacitors C1 and C2 should be the same type of capacitor so the leakage characteristics of both capacitors are the same. If $I_{IN}$ is supplied periodically in a refresh cycle, then voltage doubler 110 must operate at a rate faster than $I_{IN}$ refresh cycle.

In AC applications, compensation capacitor C2 serves as a functional capacitor controlling output voltage $V_C$ along with capacitor C1 and the capacitance of the two capacitors should be sized with this fact in mind. Both capacitor C1 and capacitor C2 should have half the required capacitance. When fabricated as NCAPs or PCAPS, capacitor C1 and capacitor C2 should have equal gate areas. When fabricated as MIMCAPS, capacitor C1 and capacitor C2 should have equal plate areas.

Figure 4:
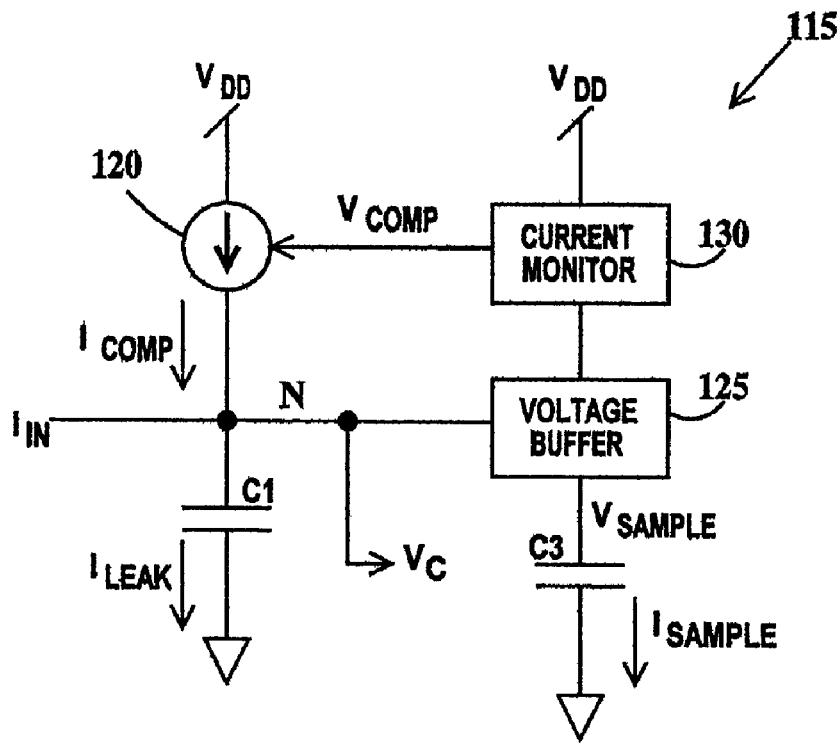
FIG. 4 is a block diagram of a circuit illustrating a method for compensating a leakage current through a capacitor according to a third embodiment of the present invention.

FIG. 4 is a block diagram of a circuit 115 illustrating a method for compensating for leakage through a capacitor according to a third embodiment of the present invention. In FIG. 4, input current $I_{IN}$ is applied to node N and output voltage $V_C$ is supplied from node N. Capacitor C1 is connected between node N and ground. Compensation current $I_{COMP}$ is supplied to node N by a variable current source 120 connected to voltage source $V_{DD}$. A voltage buffer 125 is connected between node N and a current monitor 130. A current monitor 130 is connected between the control input of current source 120 and voltage buffer 125. Current monitor 130 is connected to voltage source $V_{DD}$. A sampling capacitor C3 is connected between voltage buffer 125 and ground. Voltage buffer 125 generates a sample voltage $V_{SAMPLE}$ that is equal to voltage $V_C$. (A voltage buffer transfers voltage at its input to voltage at its output without adding current load.) Voltage $V_{SAMPLE}$ charges capacitor C3 and capacitor C3 leaks a leakage current $I_{SAMPLE}$ to ground which is monitored by current monitor 130. Current monitor 130 generates a control voltage $V_{COMP}$ which is used by current source 120 to generate $I_{COMP}$ in proportion to $I_{SAMPLE}$ such that $I_{COMP}=I_{LEAK}$. If R is the capacitance of capacitor C1 divided by the capacitance of capacitor C3, then $I_{COMP}=R \times I_{SAMPLE}$. Therefore, voltage $V_C$ will remain constant between current $I_{IN}$ refresh cycles and the capacitance of capacitor C3 can be made very small compared to capacitance of capacitor C1.

Capacitors C1 and C3 should be the same type of capacitor so the leakage characteristics of both capacitors are the same. When fabricated as NCAPs or PCAPs, capacitor C1 and capacitor C3 would have gate areas in the ratio R. When fabricated as MIMCAPs, capacitor C1 and capacitor C2 would have plate areas in the ratio R.

Figure 11:
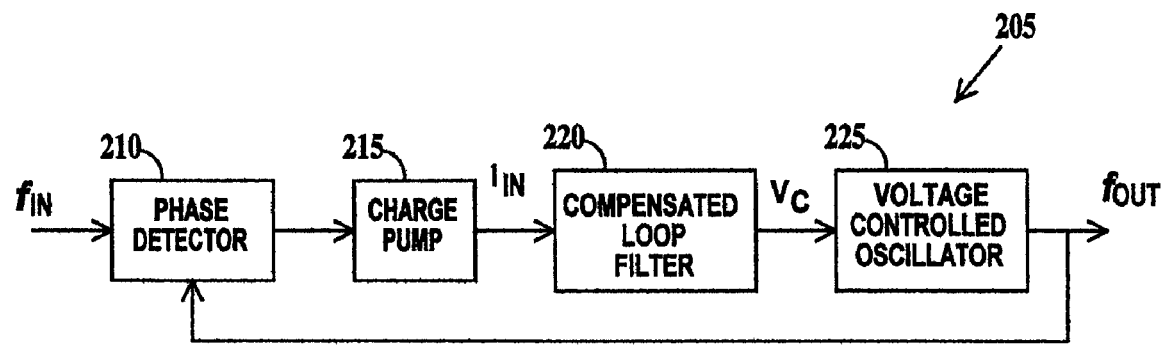
FIG. 11 is a block diagram of a PLL circuit according to the present invention.
Figure 12:
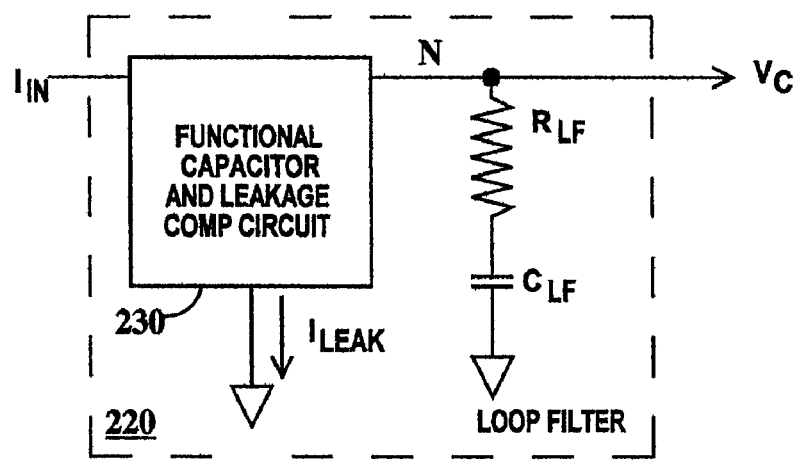
FIG. 12 is a block diagram of the compensated loop filter of FIG. 11.

When used in a typical phase-locked-loop application as illustrated in FIGS. 11 and 12 and described infra, the functional capacitor C1 is a NCAP having a capacitance of about 150 pF. The resulting leakage current $I_{LEAK}$ through this capacitor would be about 200 uA at $V_C$=1.0 v. If a value of R=20 were used, the resulting ISAMPLE would be equal to 10 uA.

Figure 5:
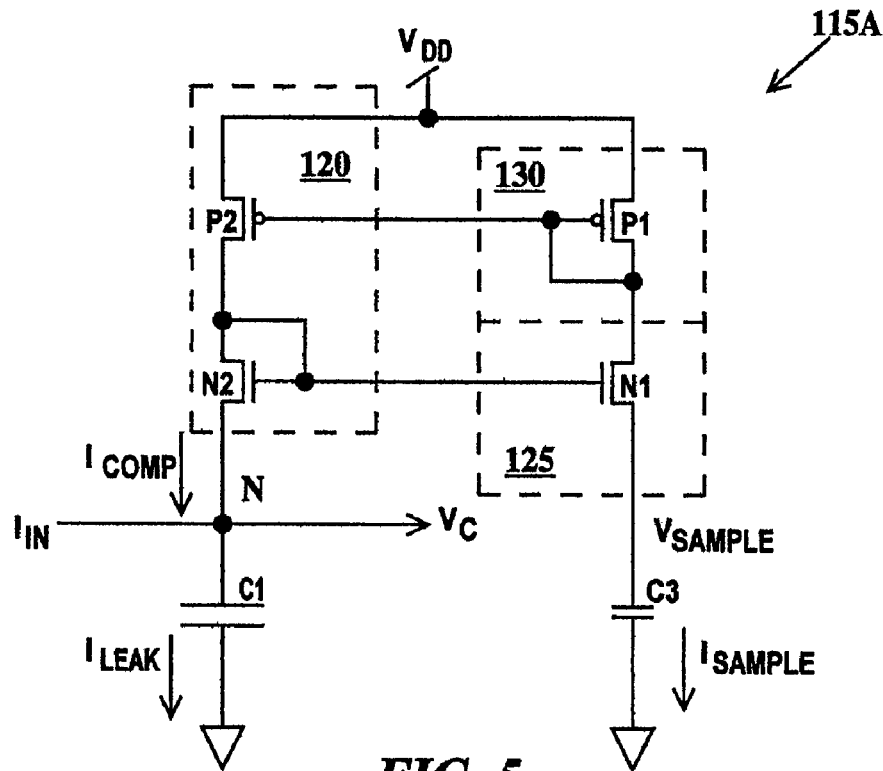
FIG. 5 is a detailed schematic diagram of a circuit illustrating the method for compensating a leakage current through a capacitor according to the third embodiment of the present invention.

FIG. 5 is a detailed schematic diagram of a circuit 115A illustrating the method for compensating for leakage through a capacitor according to the third embodiment of the present invention. In FIG. 4, voltage buffer 125 includes an NFET N1, current monitor 130 includes a PFET P1 and current source 120 includes a PFET P2 and an NFET P2. The sources of PFETs P1 and P2 are connected to $V_{DD}$. The drains of PFET P1 and NFET N1 are connected to the gates of PFET P1 and PFET P2 respectively. The drains of PFET P2 and NFET N2 are connected to the gates of NFET N1 and NFET N2. The source of NFET N1 is coupled to a first plate of capacitor C3 and a second plate of capacitor C3 is connected to ground. The source of NFET N2 is coupled to node N. Node N is coupled to a first plate of capacitor C1 and a second plate of capacitor C1 is coupled to ground. Current $I_{IN}$ is connected to node N and voltage $V_C$ is supplied from node N. Capacitor C1 has a capacitance of R times the capacitance of capacitor C3, PFET P2 has a width/length ratio (W/L) R times the W/L of PFET P1 and NFET N2 has a W/L of R times the W/L of NFET N1.

Figure 6:
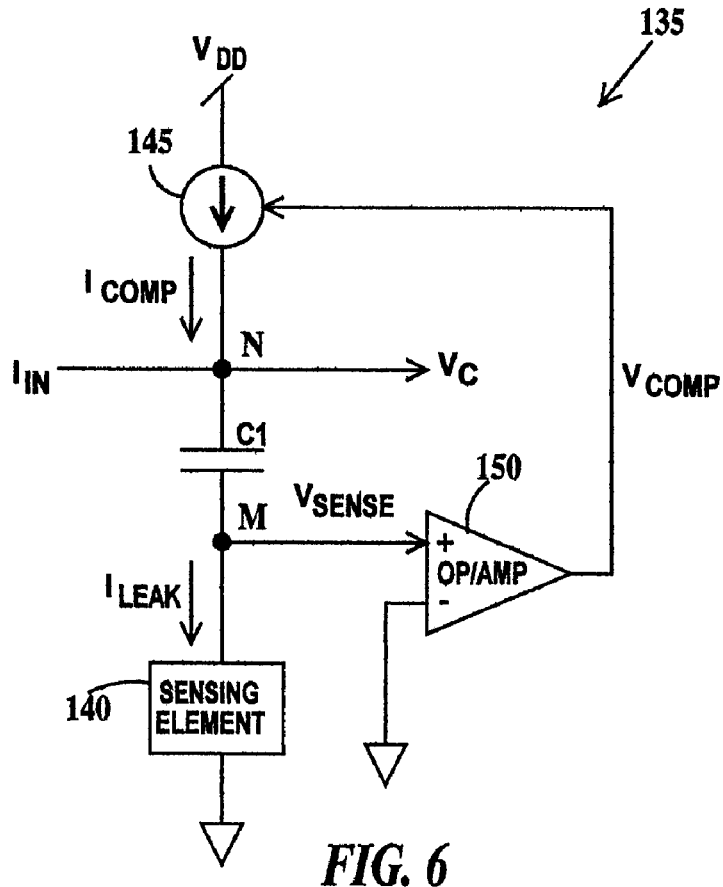
FIG. 6 is a block diagram of a circuit illustrating a method for compensating a leakage current through a capacitor according to a fourth embodiment of the present invention.

FIG. 6 is a block diagram of a circuit 135 illustrating a method for compensating for leakage through a capacitor according to a fourth embodiment of the present invention. In FIG. 6, input current $I_{IN}$ is applied to node N and output voltage $V_C$ is supplied from node N. Capacitor C1 is connected between node N and a node M. A sensing element 140 is connected between node M and ground. In one example, sensing element 140 is a resistor. Compensation current $I_{COMP}$ is supplied to node N by a variable current source 145 connected to voltage source $V_{DD}$. A positive input of an operational amplifier 150 is connected to node M and a negative input of the operational amplifier is connected to ground. The output of operational amplifier 150 is connected to the control input of current source 145. Operational amplifier 150 generates a control voltage $V_{COMP}$ in response to a voltage $V_{SENSE}$ on node M, which is used by current source 145 to generate $I_{COMP}$ in proportion to $I_{SAMPLE}$ such that $I_{COMP}=I_{LEAK}$. Voltage $V_{SENSE}$ is proportional to current $I_{LEAK}$, therefore, voltage $V_C$ will remain constant between current $I_{IN}$ refresh cycles.

Figure 7:
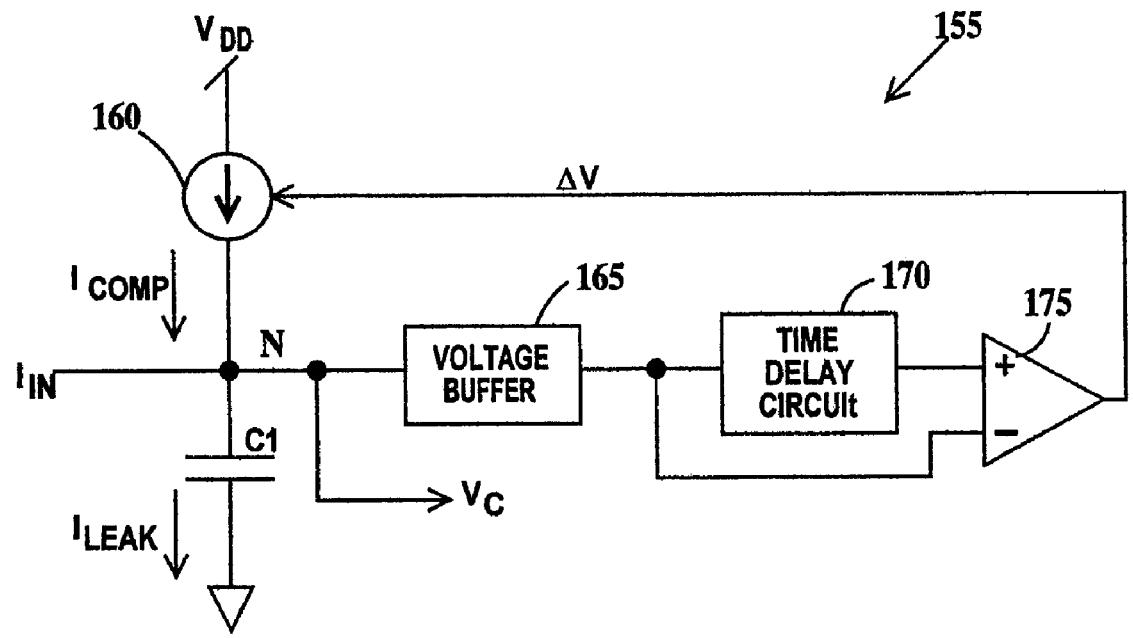
FIG. 7 is a block diagram of a circuit illustrating a method for compensating a leakage current through a capacitor according to a fifth embodiment of the present invention.

FIG. 7 is a block diagram of a circuit 155 illustrating a method for compensating for leakage through a capacitor according to a fifth embodiment of the present invention. In FIG. 7, input current $I_{IN}$ is applied to node N and output voltage $V_C$ is supplied from node N. Capacitor C1 is connected between node N and ground. Compensation current $I_{COMP}$ is supplied to node N by a variable current source 160 connected to voltage source $V_{DD}$. An input of voltage buffer 165 is connected to node N and output of the voltage buffer is connected to the input of a time delay circuit 170 (that delays voltage signal $V_C$ by an amount of time $\Delta T$) and a first input of an operational amplifier 175. The output of time delay circuit 170 is connected to a second input of operational amplifier 175. Operational amplifier 175 generates a voltage signal $\Delta V$, which is coupled to the control input of current source 160.

$V_{COMP}$ is used by current source 160 to generate $I_{COMP}$ to replace the amount of charge lost over delay $\Delta T$ such that $I_{COMP}=I_{LEAK}$ based on equation (1):

$$(\Delta I_{LEAK} - x \Delta T) = C1 \times V_{COMP} \qquad (1)$$

where:

$\Delta I_{LEAK}$=the amount of current leaked by capacitor C1;

$\Delta T$=the time delay of time delay circuit 165;

C1=the capacitance of capacitor C1; and $\Delta V$=the difference in the voltage level of $\Delta V$ over time $\Delta T$.

When $I_{IN}$ is applied as pulses, sampling interval $\Delta T$ should be smaller than the frequency of $I_{IN}$ pulses required to keep capacitor C1 fully charged.

Figure 8:
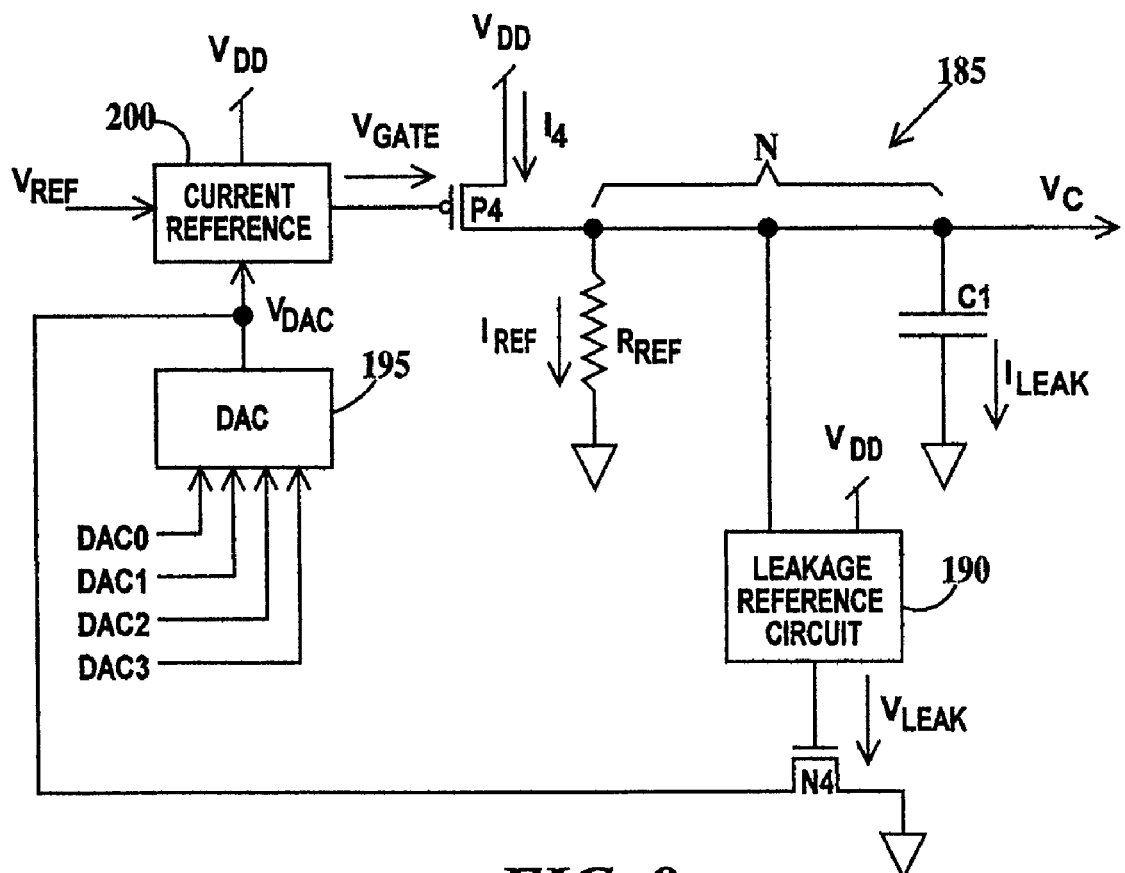
FIG. 8 is a schematic block diagram of a circuit illustrating a method for compensating a leakage current through a capacitor according to a sixth embodiment of the present invention.

FIG. 8 is a schematic block diagram of a circuit 185 illustrating a method for compensating for leakage through a capacitor according to a sixth embodiment of the present invention. In FIG. 8, capacitor C1 is connected between node N and ground and output voltage $V_C$ is supplied from node N. A reference resistor $R_{REF}$ is connected between node N and ground. A leakage reference circuit 190, coupled to voltage source $V_{DD}$, is connected between node N and the gate of an NFET N4. The source of NFET N4 is connected to ground and the drain of NFET N4 is connected to the output of a digital to analog converter (DAC) 195. DAC 195 has four digital inputs DAC0, DAC1, DAC2 and DAC3, which determine the current conducted by the DAC. The output of DAC 195 is connected to a first input of a current reference circuit 200. A reference voltage $V_{REF}$ is supplied to a second input of current reference circuit 200. Current reference circuit 200 is also coupled to voltage source $V_{DD}$. The output of current reference circuit 200 is connected to the gate of a PFET P4. The source of PFET P4 is connected to voltage source $V_{DD}$ and the drain of PFET P4 is connected to node N.

In operation, current reference circuit 200 outputs a control voltage $V_{GATE}$, which controls PFET P4. A predetermined amount of current, $I_{REF}$, flows through resistor $R_{REF}$ generating voltage $V_C$ on node N. Leakage reference circuit 190 generates a voltage based on the leakage current $I_{LEAK}$ through capacitor C1 in order to add a proportional amount of current to the output of DAC 195, which in turn causes the voltage $V_{GATE}$ generated by current reference circuit 200 to decrease, causing the current $I_4$ to node N supplied by voltage source $V_{DD}$ to increase to compensate for the leakage through capacitor C1. Therefore, voltage $V_C$ will remain constant as $I_4$ is compensating for $I_{LEAK}$ through capacitor C1.

Figure 9:
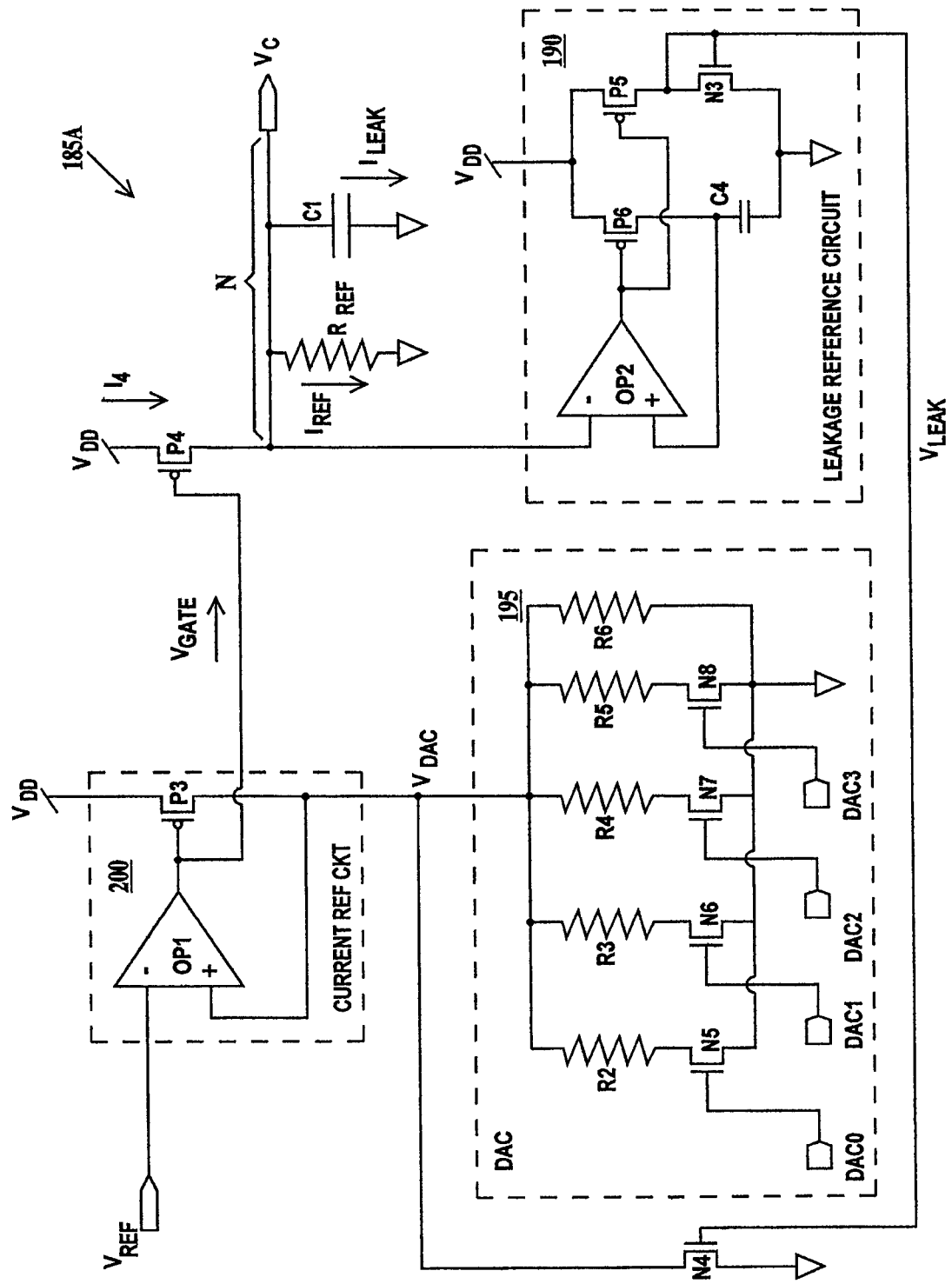
FIG. 9 is a detailed schematic diagram of the circuit of FIG. 8.

FIG. 9 is a detailed schematic diagram of circuit 185 illustrated in FIG. 8. In FIG. 9, resistor $R_{REF}$ and capacitor C1 are connected to node N and PFET P4 is connected to node N and voltage source $V_{DD}$ as illustrated in FIG. 8 and described supra. Current reference circuit 200 includes an operational amplifier OP1 and a PFET P3. A first input of operational amplifier OP1 is connected to $V_{REF}$ and a second input of operational amplifier OP1 is connected to the output of DAC 195 and the drain of PFET P3. The output of operational amplifier OP1 is connected to the gates of PFETs P3 and P4.

Leakage reference circuit 190 includes a unity gain operational amplifier OP2, PFETs P5 and P6, an NFET N3 wired as a diode and a leakage reference capacitor C4. A first input of operational amplifier OP2 is connected to the drain of PFET P4 and a second input of operational amplifier OP2 is connected to the drain of PFET P6 and a first plate of capacitor C4. A second plate of capacitor C4 is connected to ground. The output of operational amplifier OP2 is connected to the gates of PFETs P5 and P6. The sources of PFETs P5 and P6 are connected to voltage source $V_{DD}$. The drain of PFET P5 and NFET N3 are connected to the gates of NFETs N3 and N4. The source of NFET N4 is connected to ground and the drain of NFET N4 is connected to the output of DAC 195 (and hence to the drain of PFET P3).

DAC 195 includes inputs DAC0, DAC1, DAC2 and DAC3, and NFET N5, NFET N6, NFET N7, NFET N8, and resistor R2, resistor R3, resistor R4, resistor R5 and resistor R6. Inputs DAC0, DAC1, DAC2 and DAC3 are connected respectively to the gates of NFETs N5, N6, N7 and N8. The sources of NFETs N5, N6, N7 and N8 are connected to ground. The drains of NFETs N5, N6, N7 and N8 are connected respectively to first terminals of resistors R2, R3, R4 and R5. A first terminal of resistor R6 is connected to ground. The second terminals of resistors R2, R3, R4, R5 and R6 are connected to the output of DAC 195.

In operation, current in PFET P3 is mirrored into resistor $R_{REF}$ and the voltage level of $V_C$ is established. Capacitor C4 is biased to $V_C$ by operational amplifier OP2 and PFET P6 to cause the capacitor to conduct a current in an amount proportional to the ratio of capacitances of capacitor C4 the capacitance of capacitor C1. The current required to bias capacitor C4 at voltage $V_C$ is mirrored by PFET P6 onto NFET N3 and a bias control voltage $V_{LEAK}$ is established on the drain of NFET N3. $V_{LEAK}$ controls the gate of NFET N4 in order to drain a proportional amount of current from the node $V_{DAC}$ to cause a current increase through PFET P4, which is sufficient to offset the leakage current ($I_{LEAK}$) through capacitor C1.

Therefore, $V_{DC}$ is kept nearly constant by monitoring the leakage through capacitor C1 and reflecting that leakage back into a current reference to offset the effects of leakage current through capacitor C1.

Capacitors C1 and C4 should be the same type of capacitor so the leakage characteristics of both capacitors are the same. When fabricated as NCAPs or PCAPS, capacitor C4 conducts a current in proportion to the gate area of capacitor C4 divided by the gate area of capacitor C1. When fabricated as MIMCAPS, capacitor C4 conducts a current in proportion to the plate area of capacitor C4 divided by the plate area of capacitor C1.

Figure 10:
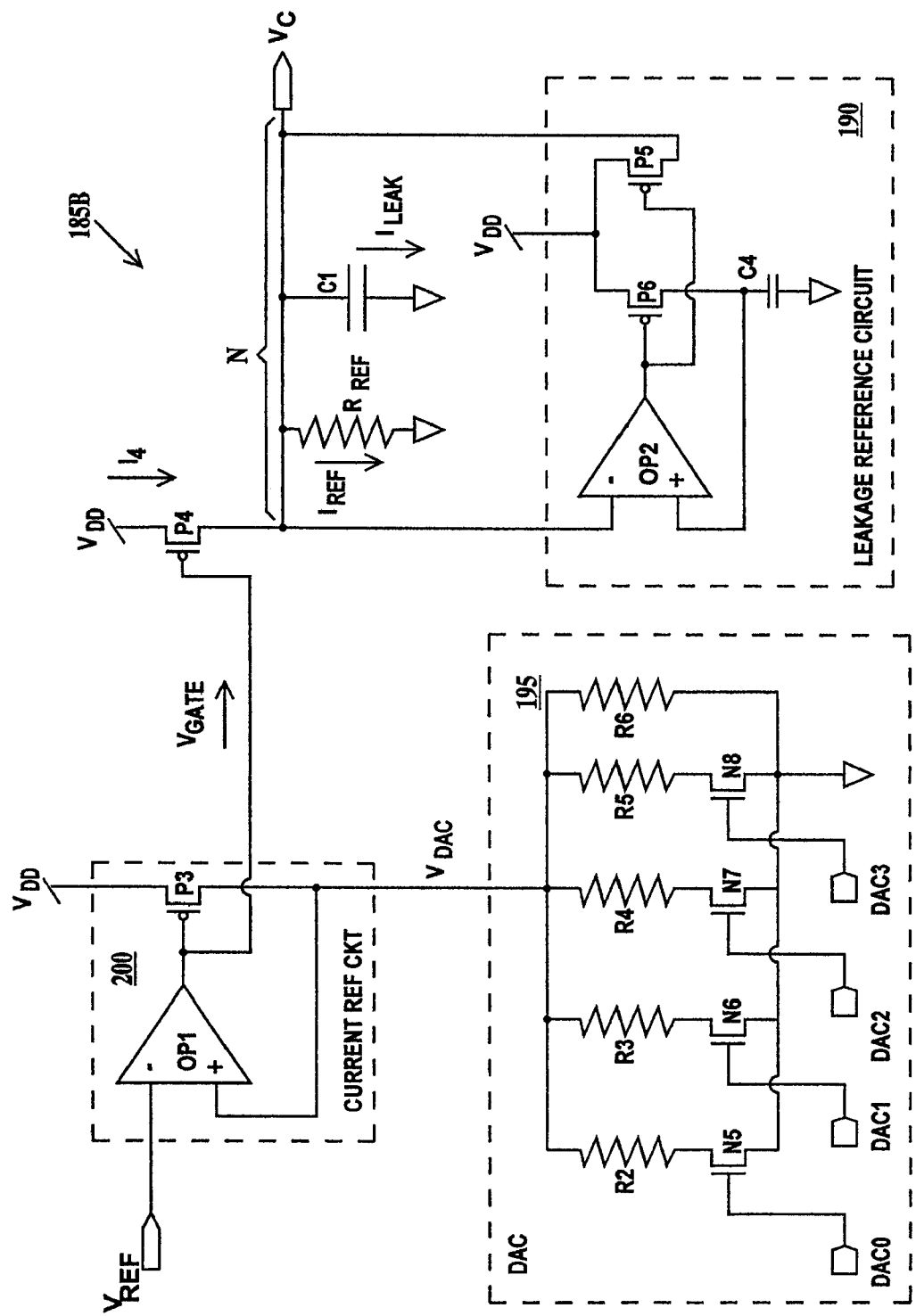
FIG. 10 is a detailed schematic diagram of an alternative circuit to the circuit of FIG. 9.

FIG. 10 is a detailed schematic circuit diagram of an alternative circuit 185B to the circuit of FIG. 9. Circuit 185B may be used to supply compensating current directly to node N from PFET P5 in applications where saturation margin of devices supplied by node N exists to maintain current mode devices in saturation.

In FIG. 10, leakage reference circuit 190 includes operational amplifier OP2, PFET P6, capacitor C4 and PFET P5 as illustrated in FIG. 9 and described above, but with NFETs N3 and N4 of FIG. 9 removed, thus the drain of PFET P5 is connected directly to node N.

In operation, a leakage current flows through capacitor C4, which is proportional to the leakage current in capacitor C1. The strength (beta) of PFET P5 is sized to supply as much current into node N as leaks away from node N through capacitor C1. This is accomplished through the negative feedback action of operational amplifier OP2. With the current into node N and out of node N in equilibrium, the voltage on node N remains constant independent of leakage through capacitor C1.

Capacitors C1 and C4 should be the same type of capacitor so the leakage characteristics of both capacitors are the same. When fabricated as NCAPs or PCAPs, capacitor C4 conducts a current in proportion to the gate area of capacitor C4 divided by the gate area of capacitor C1. When fabricated as MIMCAPS, capacitor C4 conducts a current in proportion to the plate area of capacitor C4 divided by the plate area of capacitor C1.

FIG. 11 is a block diagram of a PLL circuit 205 according to the present invention. In FIG. 11, PLL circuit 205 includes, coupled in series as recited, a phase detector 210 for receiving an input frequency $f_{IN}$ and comparing with an output frequency $f_{OUT}$, a charge pump 215 for supplying input current $I_{IN}$ to a compensated loop filter 220, which supplies voltage $V_C$ to a voltage controlled oscillator (VCO) 225 for generating an output frequency $f_{OUT}$. Output frequency $f_{OUT}$ is feedback to phase detector 210. The operations of PLL circuits are well known, as are various circuits for phase detector 210, charge pump 215 and VCO 225. While loop filters for PLLs are well known, compensated loop filter 220 utilizes novel features of the present invention as illustrated in FIG. 12 and described infra.

In prior art PLL circuits, the phase detector determines if the charge pump supplies or removes charge from the loop filter based on the relationship between $f_{IN}$ and $f_{OUT}$. In principle, a functional capacitor in the loop filter holds the output voltage of the loop filter to a fixed value, which is true as long as the functional capacitor is refreshed periodically by the charge pump to compensate for current leakage through the functional capacitor to ground. If $f_{OUT}$ is greater than $f_{INT}$ then charge is removed from the loop filter causing the control voltage on the function capacitor to decrease and hence causing the VCO to slow down. If $f_{OUT}$ is less than $f_{INT}$ then charge is added to the loop filter causing the control voltage on the function capacitor to increase and hence causing the VCO to speed up. However, if the functional loop capacitor leaks faster than the charge pump can cycle and add charge to the loop filter, $V_C$ and hence $f_{OUT}$ will drift within a voltage range. The present invention solves this problem.

FIG. 12 is a schematic block circuit diagram of compensated loop filter 220 of FIG. 11. In FIG. 12, compensated loop filter 220 includes a functional capacitor and leakage compensation circuit 230 for receiving input current $I_{IN}$ and generating output voltage $V_C$ on node N. A first terminal of a secondary resistor $R_{LF}$ is connected to node N and second terminal of resistor $R_{LF}$ is connected to a first plate of a secondary capacitor $C_{LF}$. A second plate of capacitor $C_{LF}$ is connected to ground.

Functional capacitor and leakage compensation circuit 230 contains the functional capacitor for maintaining node N at VC. This functional capacitor is the same as capacitor C1 illustrated in FIGS. 2, 3, 4, 5, 6, 7, 8, 9 and 10 and describe supra. Any of circuits 100, 105, 115, 115A, 135, 155, 185, 185A or 185B of respective FIGS. 2, 3, 4, 5, 6, 7, 8, 9 and 10 may be substituted for functional capacitor and leakage compensation circuit 230.

An enhancement that may be applied to any or all of the embodiments if the present invention described supra, is to turn the tunneling leakage compensation current on and off based on the effective RC time constant of the capacitor. Jitter on the voltage output can be caused by the tunneling leakage compensation current source asserting a voltage bias whenever it is supplying current. As stated supra, $I_{IN}$ is a correction current applied to node N to keep control capacitor C1 charged, thus holding output voltage $V_C$ and node N constant. However, control capacitor C1 has a "resistance" $R_{EFF}$ (due the leakage current flowing through it) giving a time constant $R_{EFF}C1$. The tunneling leakage frequency equivalent is $1/R_{EFF}C1$.

In applications where correction current $I_{IN}$ is refreshed periodically there is an average correction frequency associated with $I_{IN}$. When the correction frequency is high, little or no tunneling leakage compensation current is required because $I_{IN}$ is much larger than $I_{LEAK}$. Tunneling leakage compensation is needed only when the correction current frequency above some arbitrary minimum correction is low. Therefore, tunneling leakage compensation may be turned off until the correction frequency drops below $K/R_{EFF}C1$, where K is a fixed number. At smaller values of K, there is more jitter and at, a higher values of K the tunneling leakage compensation will never turn off. Therefore, K must be selected between these two extremes. In one example, K is 10 or 100.

A example of this enhancement is, given a supply voltage of 1 volt, 200 microamperes of tunneling current leakage through a 1.5 picofarad control capacitor, yields an effective RC of 750 nanoseconds or an equivalent tunnel current frequency of about 1.3 MHz. Tunneling leakage current compensation is invoked when the correction frequency dips below 130 MHz (K=100) or 13 MHz (K=10).

One of ordinary skill in the art would be able to modify the tunneling leakage compensation circuits described supra in order to implement the aforementioned enhancement.

While the present invention has been described being used in the particular application of a PLL circuit, the capacitor leakage compensation circuits and method described supra may be used in other applications such as sample and hold circuits, switched capacitor circuits, reference decoupling (FIGS. 9 and 10 are examples), continuous time filters such as Gm-C filters, etc. Thus, the present invention provides various methods and circuits for compensating for capacitor leakage in very precise analog and digital circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A circuit comprising:
a capacitor coupled between a first circuit node and a second circuit node and that leaks a leakage current from said first circuit node to said second circuit node; and
a compensation circuit adapted to supply a compensatory current to compensate for said leakage current to said first circuit node, said compensation circuit including an additional capacitor connected between a voltage source and said first circuit node.

2. The circuit of claim 1, wherein said second circuit node is ground.

3. The circuit of claim 1, wherein the capacitance of said additional capacitor is about equal to the capacitance of said capacitor and the leakage of said additional capacitor is about equal to the leakage of said capacitor.

4. The circuit of claim 1,
wherein said voltage source is a voltage doubler, an input to said voltage doubler connected to said first circuit node.

5. The circuit of claim 1, wherein
said voltage source comprises a voltage buffer, said voltage buffer adapted to generate a voltage across said additional capacitor based on the voltage on said first circuit node; and
said compensation circuit including a current monitor connected to said voltage buffer and adapted to control an amount of current supplied from said current source to said first circuit node based on a leakage current from said additional capacitor to said second circuit node.

6. The circuit of claim 5, wherein said current source supplies an amount of current to said first circuit node that is equal a leakage current of said additional capacitor times the capacitance of said capacitor divided by the capacitance of said additional capacitor.

7. The circuit of claim 1, wherein said capacitor is selected from the group consisting eta PFET capacitor, an NFET capacitor, a metal-insulator-metal capacitor, a trench capacitor, a deep trench capacitor, an electrolytic capacitor, a tantalum capacitor, a mica capacitor and a ceramic capacitor.

8. The circuit of claim 1 further including:
means for supplying a correction current to said first node at a correction frequency;
means for switching said compensatory current off when said correction frequency is greater than a multiple of an equivalent frequency of said compensatory current and for switching said compensatory current on when said correction frequency is less than said multiple of said equivalent compensatory current frequency; and
wherein said equivalent compensatory current frequency is defined as one divided by the effective resistance of said capacitor attributable to said leakage current, times the capacitance of said capacitor.

9. A circuit comprising:
a capacitor coupled between a first circuit node and a second circuit node and that leaks a leakage current from said first circuit node to said second circuit node; and a compensation circuit adapted to supply a compensatory current to compensate for said leakage current to said first circuit node, said compensation circuit including:
a current source connected between a voltage source and said first circuit node;
a sensing element connected between said capacitor and said second circuit node; and
an operational amplifier, a first input of said amplifier connected to a third circuit node between said capacitor and said sensing element, a second input of said amplifier connected to said second circuit node, and the output of said amplifier adapted to control an amount of current supplied from said current source to said first circuit node based on an amount of said leakage current.

10. The circuit of claim 9, wherein said sensing element is a resistor.

11. A circuit comprising:
capacitor coupled between a first circuit node and a second circuit node and that leaks a leakage current from said first circuit node to said second circuit node; and
a compensation circuit adapted to supply a compensation current to compensate for said leakage current to said first circuit node, said compensation circuit including:
a current source connected between a voltage source and said first circuit node;
a voltage buffer connected to said first circuit node and adapted to sense a voltage on said first circuit node;
a time delay circuit connected between said voltage buffer and a first input of an operational amplifier, a second input of said operational amplifier connected between said voltage buffer and said time delay circuit, said operational amplifier generating an output signal; and
said output signal of said operational amplifier coupled to said current source in order to control an amount of current supplied from said current source to said first circuit node based on said output signal of said operational amplifier.

12. A circuit comprising:
a capacitor coupled between a first circuit node and a second circuit node and that leaks a leakage current from said first circuit node to said second circuit node; and
a compensation circuit adapted to supply current a compensatory current to compensation for said leakage current to said first circuit node, said compensation circuit including:
a reference resistor coupled between said first and second circuit nodes;
a current reference circuit coupled to tho gate of a pass gate, the source/drains of said pass gate coupled between a voltage source and said first circuit node;
a digital to analog converter connected to said current reference and adapted to control a voltage applied by said current reference to said gate of said pass gate; and
a leakage reference circuit adapted to sense a voltage on said second node, said current reference including a reference capacitor, said leakage reference circuit generating a reference current proportional to the ratio of the capacitance of said reference capacitor to the capacitance of said capacitor.

13. The circuit of claim 12, wherein said compensation circuit is adapted to either adapted to supply an amount of compensating current to said first circuit node that is about equal to said leakage current or adapted to drain an amount of current from said current reference circuit such that said pass gate supplies an amount of compensating current to said first circuit node that is about equal to said leakage current.

14. A phase locked loop circuit, comprising:
an output of a phase detector connected to an input of a charge pump;
an input of a compensated loop filter connected to an output of said charge pump;
an input of a voltage controlled oscillator connected to an output of said compensated loop filter;
an output of said voltage controlled oscillator connected to an input of said phase detector; and
said compensated loop filter comprising:
a capacitor coupled between a first circuit node and a second circuit node that leaks a leakage current from said first circuit node to said second circuit node;
a secondary resistor connected between said first circuit node and a secondary capacitor, said secondary capacitor connected between said secondary resistor and said second circuit node; and
a compensation circuit adapted to supply a compensatory current to compensate for said leakage current from said first circuit node, said compensation circuit including an additional capacitor connected between a voltage source and said first circuit node.

15. The circuit of claim 14, wherein said second circuit node is ground.

16. The circuit of claim 14, wherein the capacitance of said additional capacitor is about equal to the capacitance of said capacitor and the leakage of said additional capacitor is about equal to the leakage current of said capacitor.

17. The circuit of claim 14, wherein
wherein said voltage source is a voltage doubler, an input of said voltage doubler connected to said first circuit node.

18. The circuit of claim 14, wherein said voltage source comprises a voltage buffer, said voltage buffer adapted to generate a voltage across said additional capacitor based on the voltage on said first circuit node; and
said compensation circuit further including a current monitor connected to said voltage buffer and adapted to control an amount of current supplied from said current source to said first circuit node based on a leakage current from said additional capacitor to said second circuit node.

19. The circuit of claim 18, wherein said current source supplies an amount of current to said first circuit node that is equal a leakage current of said additional capacitor times the capacitance of said capacitor divided by the capacitance of said additional capacitor.

20. The circuit of claim 14, wherein said capacitor is selected from the group consisting of a PFET capacitor, an NFET capacitor, a metal-insulator-metal capacitor, a trench capacitor, a deep trench capacitor, an electrolytic capacitor, a tantalum capacitor, a mica capacitor and a ceramic capacitor.

21. The circuit of claim 14, further including:
means for supplying a correction current to said first node at a correction frequency;
means for switching said compensatory current off when said correction frequency is greater than a multiple of an equivalent frequency of said compensatory current and for switching said compensatory current on when said correction frequency is less than said multiple of said equivalent compensatory current frequency; and
wherein said equivalent compensatory current frequency is defined as one divided by the effective resistance of said capacitor attributable to said leakage current, times the capacitance of said capacitor.

22. A phase locked loop circuit, comprising:
an outputs of phase detector connected to an input of a charge pump;
an input of a compensated loop filter connected to an output of said charge pump;
an input of a voltage controlled oscillator connected to an output of said compensated loop filter;
an input of said voltage controlled oscillator connected to an input of said phase detector; and
said compensated loop filter comprising:
a capacitor coupled between a first circuit node and a second circuit node that leaks a leakage current from said first circuit node to said second circuit node;
a secondary resistor connected between said first circuit node and a secondary capacitor, said secondary capacitor connected between said secondary resistor and said second circuit node; and
a compensation circuit adapted to supply a compensatory current to compensate for said leakage current from said first circuit node, said compensation circuit including:
a current source connected between a voltage source and said first circuit node;
a sensing element connected between said capacitor and said second circuit node; and
an operational amplifier, a first input of said amplifier connected to a third circuit node between said capacitor and said sensing element, a second input of said amplifier connected to said second circuit node, and the output of said amplifier adapted to control an amount of current supplied from said current source to said first circuit node based on an amount of said leakage current.

23. The circuit of claim 22, wherein said sensing element is a resistor.

24. A phase locked loop circuit, comprising:
an output of a phase detector connected to an input of a charge pump;
an input of a compensate loop filter connected to an output of said charge pump;
an input of a voltage controlled oscillator connected to an output of said compensated loop filter;
and output of said voltage controlled oscillator connected to an input of said phase detector; and
said compensated loop filter comprising:
a capacitor coupled between a first circuit node and a second circuit node that leaks a leakage current from said first circuit node to said second circuit node;
a secondary resistor connected between said first circuit node and a secondary capacitor, said secondary capacitor connected between said secondary resistor and said second circuit node; and
a compensation circuit adapted to supply a compensatory current to compensate for said leakage current from said first circuit node, said compensation circuit including:
a current source connected between a voltage source and said first circuit node;
a voltage buffer connected to said first circuit node and adapted to sense a voltage on said first circuit node;

a time delay circuit connected between said voltage buffer and a first input of an operational amplifier, a second input of said operational amplifier connected between said voltage buffer and said time delay circuit, said operational amplifier generating an output signal; and said output signal of said operational amplifier coupled to said current source in order to control an amount of current supplied from said current source to said first circuit node based on said output signal of said operational amplifier.

25. A phase locked loop circuit, comprising:

an output of a phase detector connected to an input of a charge pump;

an input of a compensated loop filter connected to an output of said charge pump;

an input of a voltage controlled oscillator connected to an output of said compensated loop filter;

and output of said voltage controlled oscillator connected to an input of said phase detector; and said compensated loop filter comprising:

a capacitor coupled between a first circuit node and a second circuit node that leaks a leakage current from said first circuit node to said second circuit node;

a secondary resistor connected between said first circuit node and a secondary capacitor, said secondary capacitor connected between said secondary resistor and said second circuit node; and a compensation circuit adapted to supply a compensatory current to compensate for said leakage current from said first circuit node, said compensation circuit including:

a reference resistor coupled between said first and second circuit nodes;

a current reference circuit coupled to the gate of a pass gate, the source/drains of said pass gate coupled between a voltage source and said first circuit node;

a digital to analog converter connected to said current reference and adapted to control a voltage applied by said current reference to said gate of said pass gate; and a leakage reference circuit adapted to sense a voltage on said second node, said current reference including a reference capacitor, said leakage reference circuit generating a reference current proportional to the ratio of the capacitance of said reference capacitor to the capacitance of said capacitor.

26. The circuit of claim 25, wherein said compensation circuit is adapted to either to supply an amount of compensating current to said first circuit node that is about equal to said leakage current or adapted to drain an amount of current from said current reference circuit such that said pass gate supplies an amount of compensating current to said first circuit node that is about equal to said leakage current.

27. A method of compensating a capacitor that leaks current between a first circuit node and a second circuit node, comprising:

providing said capacitor;

coupling said capacitor between said first circuit node and said second circuit node; and coupling to said first circuit node, a compensation circuit adapted to supply a compensatory current to compensate for said leakage current to said first circuit node, said compensation including an additional capacitor connected between a voltage source and said first circuit node.

28. The method of claim 27, wherein said second circuit node is ground.

29. The method of claim 27, wherein the capacitance of said additional capacitor is about equal to the capacitance of said capacitor and the leakage of said additional capacitor is about equal to the leakage of said capacitor.

30. The method of claim 27, wherein said voltage source is a voltage doubler, an input to said voltage doubler connected to said first circuit node.

31. The method of claim 27, said voltage source comprises a voltage buffer, said voltage buffer adapted to generate a voltage across said additional capacitor based on the voltage on said first circuit node; and said compensation circuit including a current monitor connected to said voltage buffer and adapted to control an amount of current supplied from said current source to said first circuit node based on a leakage current from said additional capacitor to said second circuit node.

32. The circuit of claim 31, wherein said current source supplies an amount of current to said first circuit node that is equal a leakage current of said additional capacitor times the capacitance of said capacitor divided by the capacitance of said additional capacitor.

33. The method of claim 27, wherein said capacitor is selected from the group consisting of a PFET capacitor, an NFET capacitor, a metal-insulator-metal capacitor, a trench capacitor, a deep trench capacitor, an electrolytic capacitor, a tantalum capacitor, a mica capacitor and a ceramic capacitor.

34. The method of claim 27, further including:

supplying a correction current to said first node at a correction frequency;

switching said compensatory current off when said correction frequency is greater than a multiple of an equivalent frequency of said compensatory current and switching said compensatory current on when said correction frequency is less than said multiple of said equivalent compensatory current frequency; and wherein said equivalent compensatory current frequency is defined as one divided by the effective resistance of said capacitor attributable to said leakage current, times the capacitance of said capacitor.

35. A method of compensating a capacitor that leaks current between a first circuit node and a second circuit node, comprising:

providing said capacitor;

coupling said capacitor between said first circuit node and said second circuit node; and coupling to said first circuit node, a compensation circuit adapted to supply a compensatory current to compensate for said leakage current to said first circuit node, said compensation including:

a current source connected between a voltage source and said first circuit node;

a sensing element connected between said capacitor and said second circuit node; and an operational amplifier, a first input of said amplifier connected to a third circuit node between said capacitor and said sensing element, a second input of said amplifier connected to said second circuit node, and the output of said amplifier adapted to control an amount of current supplied from said current source to said first circuit node based on an amount of said leakage current.

36. The method of claim 35, wherein said sensing element is a resistor.

37. A method of compensating a capacitor that leaks current between a first circuit node and a second circuit node, comprising:
providing said capacitor;
coupling said capacitor between said first circuit node and said second circuit node; and
coupling to said first circuit node, a compensation circuit adapted to supply a compensatory current to compensate for said leakage current to said first circuit node, said compensation including:
  a current source connected between a voltage source and said first circuit node;
  a voltage buffer connected to said first circuit node and adapted to sense a voltage on said first circuit node;
  a time delay circuit connected between said voltage buffer and a first input of an operational amplifier, a second input of said operational amplifier connected between said voltage buffer and said time delay circuit, said operational amplifier generating an output signal; and
  said output signal of said operational amplifier coupled to said current source in order to control an amount of current supplied from said current source to said first circuit node based on said output signal of said operational amplifier.

38. A method of compensating a capacitor that leaks current between a first circuit node and a second circuit node, comprising:
providing said capacitor:
coupling said capacitor between said first circuit node and said second circuit node; and coupling to said first circuit node, a compensation circuit adapted to supply a compensatory current to compensate for said leakage current to said first circuit node, said compensation including:
  a reference resistor coupled between said first and second circuit nodes;
  a current reference circuit coupled to the gate of a pass gate, the source/drains of said pass gate coupled between a voltage source and said first circuit node;
  a digital to analog converter connected to said current reference and adapted to control a voltage applied by said current reference to said gate of said pass gate; and
  a leakage reference circuit adapted to sense a voltage on said second node, said current reference including a reference capacitor, said leakage reference circuit generating a reference current proportional to the ratio of the capacitance of said reference capacitor to the capacitance of said capacitor.

39. The method of claim 38, wherein said compensation circuit is adapted to either-supply an amount of compensating current to said first circuit node that is about equal to said leakage current or adapted drain an amount of current from said current reference circuit such that said pass gate supplies an amount of compensating current to said first circuit node that is about equal to said leakage current.

* * * * *

UNITED STATES PATENT AND TRADEMARK OFFICE
CERTIFICATE OF CORRECTION

PATENT NO. : 6,956,417 B2
APPLICATION NO. : 10/707123
DATED : October 18, 2005
INVENTOR(S) : Bernstein et al.

It is certified that error appears in the above-identified patent and that said Letters Patent is hereby corrected as shown below:

On the First Page of the Patent, Under Inventors
Delete "Allen P. Haar, Essex Junction, VT (US)" and insert --Allen P. Haar, State College, PA (US)--

Column 9
Line 44, delete "eta" and insert --of a--

Column 10
Line 10, delete "clement" and insert --element--
Line 19, delete "capacitor" and insert --a capacitor--
Line 23, delete "compensation" and insert --compensatory--
Line 53, delete "tho" and insert --the--

Column 12
Line 8, delete "outputs of phase" and insert --output of a phase--
Line 14, delete "input" and insert --output--
Line 34, delete "clement" and insert --element--
Line 45, delete "compensate" and insert --compensated--

Signed and Sealed this

Thirtieth Day of January, 2007

JON W. DUDAS
*Director of the United States Patent and Trademark Office*